United States Patent
Fu et al.

(10) Patent No.: US 8,920,667 B2
(45) Date of Patent: Dec. 30, 2014

(54) CHEMICAL-MECHANICAL POLISHING COMPOSITION CONTAINING ZIRCONIA AND METAL OXIDIZER

(71) Applicant: Cabot Microelectronics Corporation, Aurora, IL (US)

(72) Inventors: Lin Fu, Naperville, IL (US); Steven Grumbine, Aurora, IL (US); Matthias Stender, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 13/754,413

(22) Filed: Jan. 30, 2013

(65) Prior Publication Data

US 2014/0209566 A1    Jul. 31, 2014

(51) Int. Cl.
*C03C 15/00* (2006.01)
*C09G 1/02* (2006.01)

(52) U.S. Cl.
CPC ........................................ *C09G 1/02* (2013.01)
USPC ............. 216/88; 216/67; 252/79.1; 252/79.2; 252/79.3; 252/79.4

(58) Field of Classification Search
USPC .............................. 216/67, 88; 252/79.1–79.4
See application file for complete search history.

(56) References Cited

U.S. PATENT DOCUMENTS

| | | | |
|---|---|---|---|
| 5,196,353 A | 3/1993 | Sandhu et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,420,269 B2 * | 7/2002 | Matsuzawa et al. | 438/693 |
| 6,610,114 B2 * | 8/2003 | Towery et al. | 51/308 |
| 6,794,285 B2 * | 9/2004 | Matsui et al. | 438/633 |
| 6,830,503 B1 * | 12/2004 | Grumbine | 451/41 |
| 6,900,284 B2 * | 5/2005 | Lowack et al. | 528/327 |
| 7,087,530 B2 | 8/2006 | Motonari et al. | |
| 7,161,247 B2 | 1/2007 | De Rege Thesauro et al. | |
| 7,456,107 B2 * | 11/2008 | Keleher et al. | 438/692 |
| 7,678,605 B2 * | 3/2010 | Schlueter et al. | 438/95 |
| 7,897,061 B2 | 3/2011 | Dysard et al. | |
| 7,942,945 B1 | 5/2011 | Zantye et al. | |
| 2001/0049912 A1 | 12/2001 | Motonari et al. | |
| 2003/0005647 A1 | 1/2003 | Towery et al. | |
| 2004/0144755 A1 | 7/2004 | Motonari et al. | |
| 2005/0003744 A1 | 1/2005 | Feng et al. | |
| 2007/0178700 A1 * | 8/2007 | Dysard et al. | 438/689 |
| 2012/0049107 A1 | 3/2012 | Park et al. | |
| 2012/0252213 A1 | 10/2012 | Singh | |

* cited by examiner

*Primary Examiner* — Duy Deo
*Assistant Examiner* — Maki Angadi
(74) *Attorney, Agent, or Firm* — Thomas E Omholt; Ashlee B Szelag; Arlene Hornilla

(57) ABSTRACT

The invention provides a chemical-mechanical polishing composition and a method of chemically-mechanically polishing a substrate with the chemical-mechanical polishing composition. The polishing composition comprises (a) abrasive particles, wherein the abrasive particles comprise zirconia, (b) at least one metal ion oxidizer, wherein the at least one metal ion oxidizer comprises metal ions of $Co^{3+}$, $Au^+$, $Ag^+$, $Pt^{2+}$, $Hg^{2+}$, $Cr^{3+}$, $Fe^{3+}$, $Ce^{4+}$, or $Cu^{2+}$, and (c) an aqueous carrier, wherein the pH of the chemical-mechanical polishing composition is in the range of about 1 to about 7, and wherein the chemical-mechanical polishing composition does not contain a peroxy-type oxidizer.

25 Claims, No Drawings

CHEMICAL-MECHANICAL POLISHING COMPOSITION CONTAINING ZIRCONIA AND METAL OXIDIZER

BACKGROUND OF THE INVENTION

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry) for removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

Conventional CMP compositions and methods typically are not entirely satisfactory at planarizing substrates. In particular, CMP polishing compositions and methods can result in less than desirable polishing rates and high surface defectivity when applied to a substrate. Because the performance of many substrates is directly associated with the planarity of their surfaces, it is crucial to use a CMP composition and method that results in a high polishing efficiency, selectivity, uniformity, and removal rate and leaves a high quality polish with minimal surface defects.

The difficulty in creating an effective polishing composition for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

CMP compositions often contain oxidizing agents, which can react with the surface of the substrate and render the surface more susceptible to removal by mechanical abrasion. Oxidizing agents containing hydrogen peroxide have been used for this purpose, but may not provide a satisfactory removal rate for certain substrates, including those which are not highly reactive to peroxide.

Organic polymer materials, for example, have unique chemical and mechanical characteristics that must be addressed during chemical-mechanical polishing, including that they can be mechanically soft and easy to scratch. In contrast to their mechanical sensitivity, however, organic polymers are often chemically inert. The combination of these chemical and mechanical characteristics makes organic polymer dielectric materials difficult to polish using a traditional aqueous based CMP composition. Organic polymer materials typically have a dielectric constant of about 1 or more and include polymers with a relatively high organic content, polymers with a low and high organic content with a high level of porosity, polymers with relatively low organic content based upon silicon-oxygen type materials and inorganic materials, or polymers with a combination of these properties.

Phase change alloys (PCAs) are another example of substrate materials that can be relatively soft, and have unique characteristics that must be addressed during chemical-mechanical polishing. PRAM (Phase Change Access Memory) devices (also known as Ovonic memory devices) use phase change materials (PCMs) that can be electrically switched between an insulating amorphous and conductive crystalline state for electronic memory application. Typical materials suited for these applications utilize various chalcogenide (Group VIB) and Group VB elements of the periodic table (e.g., Te, Po, and Sb) in combination with one or more of In, Ge, Ga, Sn, and Ag, which are referred to as phase change alloys (PCAs). Particularly useful PCAs are germanium (Ge)-antimony (Sb)-tellurium (Te) alloys (GST alloys), such as an alloy having the formula $Ge_2Sb_2Te_5$. These materials can reversibly change physical states depending on heating/cooling rates, temperatures, and times. Other useful alloys include indium antimonite (InSb). The physical properties of many PCAs, including GST and InSb, make them soft relative to other PCM materials.

A need remains for a polishing composition and polishing methods that will exhibit desirable planarization efficiency, uniformity, and removal rate during the polishing and planarization of substrates such as organic polymer materials and PCAs, while minimizing defectivity, such as surface imperfections and damage to underlying structures and topography during polishing and planarization. The invention provides such a polishing composition and methods. These and other advantages of the invention, as well as additional inventive features, will be apparent from the description of the invention provided herein.

BRIEF SUMMARY OF THE INVENTION

The invention provides a chemical-mechanical polishing composition comprising (a) abrasive particles, wherein the abrasive particles comprise zirconia, (b) at least one metal ion oxidizer, wherein the at least one metal ion oxidizer comprises metal ions of $Co^{3+}$, $Au^+$, $Ag^+$, $Pt^{2+}$, $Hg^{2+}$, $Cr^{3+}$, $Fe^{3+}$, $Ce^{4+}$, or $Cu^{2+}$, and (c) an aqueous carrier, wherein the pH of the chemical-mechanical polishing composition is in the range of about 1 to about 7, and wherein the chemical-mechanical polishing composition does not contain a peroxy-type oxidizer.

The invention further provides a method of polishing a substrate comprising (i) providing a substrate; (ii) providing a polishing pad; (iii) providing a chemical-mechanical polishing composition comprising (a) abrasive particles, wherein the abrasive particles comprise zirconia, (b) at least one metal ion oxidizer, wherein the at least one metal ion oxidizer comprises metal ions of $Co^{3+}$, $Au^+$, $Ag^+$, $Pt^{2+}$, $Hg^{2+}$, $Cr^{3+}$, $Fe^{3+}$, $Ce^{4+}$, or $Cu^{2+}$, and (c) an aqueous carrier, wherein the pH of the chemical-mechanical polishing composition is in the range of about 1 to about 7, and wherein the chemical-mechanical polishing composition does not contain a peroxy-type oxidizer; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

DETAILED DESCRIPTION OF THE INVENTION

The invention provides a chemical-mechanical polishing composition comprising (a) abrasive particles, wherein the abrasive particles comprise zirconia, (b) at least one metal ion oxidizer, wherein the at least one metal ion oxidizer comprises metal ions of $Co^{3+}$, $Au^+$, $Ag^+$, $Pt^{2+}$, $Hg^{2+}$, $Cr^{3+}$, $Fe^{3+}$, $Ce^{4+}$, or $Cu^{2+}$, and (c) an aqueous carrier, wherein the pH of the chemical-mechanical polishing composition is in the range of about 1 to about 7, and wherein the chemical-mechanical polishing composition does not contain a peroxy-type oxidizer.

The abrasive particles can be present in the polishing composition at any suitable concentration. For example, the abrasive particles can be present in the polishing composition at a concentration of about 0.01 wt. % or more, e.g., about 0.025 wt. % or more, about 0.05 wt. % or more, about 0.075 wt. % or more, about 0.1 wt. % or more, about 0.25 wt. % or more, about 0.5 wt. % or more, or about 0.75 wt. % or more. Alternatively, or in addition, the abrasive particles can be present in the polishing composition at a concentration of about 20 wt. % or less, e.g., about 15 wt. % or less, about 10 wt. % or less, about 5 wt. % or less, about 3 wt. % or less, about 2 wt. % or less, or about 1 wt. % or less. Preferably, the abrasive particles are present in the polishing composition at a concentration of about 0.5 wt. % to about 3 wt. %.

The abrasive particles can be any suitable abrasive particles. Preferably, the abrasive particles are metal oxide abrasive particles of alumina (e.g., aluminum oxide), silica (e.g., silicon dioxide), titania (e.g., titanium dioxide), ceria (e.g., cerium oxide), zirconia (e.g., zirconium oxide), germania (e.g., germanium dioxide, germanium oxide), magnesia (e.g., magnesium oxide), co-formed products thereof, or combinations thereof. More preferably, the abrasive particles comprise zirconia particles. Even more preferably, the abrasive particles consist of zirconia particles.

The metal oxide particles can be any suitable type of metal oxide particles, e.g., fumed metal oxide particles, precipitated metal oxide particles, and condensation-polymerized metal oxide particles (e.g., colloidal metal oxide particles). The metal oxide particles, especially zirconia particles, can have any suitable particle size. The particle size of a particle is the diameter of the smallest sphere that encompasses the particle. The metal oxide particles can have an average particle size of about 10 nm or more, e.g., about 25 nm or more, about 50 nm or more, about 75 nm or more, or about 100 nm or more. Alternatively, or in addition, the metal oxide particles can have an average particle size of about 250 nm or less, e.g., about 225 nm or less, about 200 nm or less, about 175 nm or less, about 160 nm or less, or about 150 nm or less. For example, the zirconia particles can have an average particle size of about 25 nm to about 250 nm, e.g., about 35 nm to about 200 nm, about 45 nm to about 150 nm, about 50 nm to about 125 nm, about 55 nm to about 120 nm, or about 60 nm to about 115 nm.

The abrasive particles desirably are suspended in the polishing composition, more specifically in the aqueous carrier of the polishing composition. When the abrasive particles are suspended in the polishing composition, the abrasive particles preferably are colloidally stable. The term colloid refers to the suspension of abrasive particles in the aqueous carrier. Colloidal stability refers to the maintenance of that suspension over time. In the context of this invention, abrasive particles are considered colloidally stable if, when the abrasive particles are placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \le 0.5$). The value of [B]−[T]/[C] desirably is less than or equal to 0.3, and preferably is less than or equal to 0.1.

The polishing composition includes at least one metal ion oxidizer. The at least one metal ion oxidizer can be present in the polishing composition at any suitable concentration. For example, the at least one metal ion oxidizer (i.e., all of the metal ion oxidizers in total) can be present in the polishing composition at a concentration of about 0.001 wt. % or more, e.g., about 0.0025 wt. % or more, about 0.005 wt. % or more, about 0.0075 wt. % or more, about 0.01 wt. % or more, about 0.025 wt. % or more, about 0.05 wt. % or more, about 0.075 wt. % or more, or about 0.1 wt. % or more. Alternatively, or in addition, the at least one metal ion oxidizer (i.e., all of the metal ion oxidizers in total) can be present in the polishing composition at a concentration of about 5 wt. % or less, e.g., about 4.5 wt. % or less, about 4.0 wt. % or less, about 3.5 wt. % or less, about 3.0 wt. % or less, about 2.5 wt. % or less, about 2.0 wt. % or less, about 1.5 wt. % or less, about 1.0 wt. % or less, about 0.75 wt. % or less, about 0.5 wt. % or less, or about 0.25 wt. % or less. Preferably, the at least one metal ion oxidizer is (i.e., all of the metal ion oxidizers in total are) present in the polishing composition at a concentration of about 0.025 wt. % to about 0.5 wt. %.

The at least one metal ion oxidizer may be present in any suitable form. For example, the at least one metal ion oxidizer may be present in the form of a metal salt or a metal ligand complex. For the avoidance of doubt, when the metal ion oxidizer is present in the form of a metal salt or a metal ligand complex, the concentration of the metal ion oxidizer refers to the concentration of the metal ion oxidizer (e.g., the concentration of the metal salt or the metal ligand complex), and not to the concentration of the metal ion itself.

The at least one metal ion oxidizer preferably comprises metal ions of $Co^{3+}$, $Au^+$, $Ag^+$, $Pt^{2+}$, $Hg^{2+}$, $Cr^{3+}$, $Fe^{3+}$, $Ce^{4+}$, or $Cu^{2+}$. More preferably, the at least one metal ion oxidizer comprises metal ions of $Fe^{3+}$, $Cu^{2+}$, or $Ce^{4+}$. Most preferably, the at least one metal ion oxidizer comprises metal ions of $Ce^{4+}$ or $Fe^{3+}$. Suitable metal salts include, for example, nitrate, fluoride, chloride, bromide, iodide, sulfate, phosphate, acetate, oxalate, acetylacetonate, citrate, tartrate, malonate, gluconate, phthalate, succinate, perchlorate, perbromate, and periodate. Preferred metal ion oxidizers include iron nitrate ($Fe(NO_3)_3$) (i.e., ferric nitrate) and cerium ammonium nitrate (CAN).

The polishing composition does not include a peroxy-type oxidizer. A peroxy-type oxidizer is any oxidizer with at least one peroxy (—O—O—) group. For example, a peroxy-type oxidizer is an organic peroxide, inorganic peroxide, or combination thereof. Examples of compounds containing at least one peroxy group include, but are not limited to, hydrogen peroxide and its adducts such as urea hydrogen peroxide and percarbonates (e.g., sodium percarbonate), organic peroxides such as benzoyl peroxide, peracetic acid, perboric acid, and di-tert-butyl peroxide, monopersulfates ($SO_5^{2-}$), dipersulfates ($S_2O_8^{2-}$), and sodium peroxide.

The polishing composition includes an aqueous carrier. The aqueous carrier contains water (e.g., deionized water), and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water.

The polishing composition can have any suitable pH. For example, the polishing composition can have a pH in the range of about 1 to about 7 (e.g., a pH of 1.5, a pH of 2, a pH of 2.5, a pH of 3, a pH of 3.5, a pH of 4, a pH of 5, a pH of 6, or a pH in a range defined by any two of these pH values). Typically, the polishing composition has a pH of about 1 or greater. The pH of the polishing composition typically is about 7 or less. Preferably, the pH is in the range of about 1 to about 3.5, or about 2 to about 3.5.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be an acid. The acid can be any suitable acid. Typically, the acid is acetic acid, nitric acid, phosphoric acid, oxalic acid, and combinations thereof. Preferably, the acid is nitric acid. The pH adjustor alternatively can be a base. The base can be any suitable base. Typically, the base is potassium hydroxide, ammonium hydroxide, and combinations thereof. Preferably, the base is ammonium hydroxide. The pH buffering agent can be any suitable buffering agent. For example, the pH buffering agent can be a phosphate, sulfate, acetate, borate, ammonium salt, and the like. The polishing composition can comprise any suitable amount of a pH adjustor and/or a pH buffering agent, provided that a suitable amount is used to achieve and/or maintain the pH of the polishing composition within the pH ranges set forth herein.

The polishing composition optionally further comprises one or more metal complexing agents. The complexing agent is any suitable chemical additive that enhances the removal rate of the substrate layer being removed. For example, the complexing agent may be mono-, di-, tri- and poly-carboxylic acids (e.g., EDTA and citric acid); amine-containing compounds (e.g., ammonia, amino acids, amino alcohols, di-, tri-, and polyamines, and the like), and mono-, di-, tri-, and polyphosphonic acids. The complexing agent typically is a carboxylic acid, including, for example, lactic acid, tartaric acid, citric acid, malonic acid, phthalic acid, succinic acid, glycolic acid, propionic acid, acetic acid, salicylic acid, picolinic acid, 2-hydroxybutyric acid, 3-hydroxybutyric acid, 2-methyl lactic acid, or combinations thereof. Preferably, the complexing agent is malonic acid or picolinic acid.

The one or more metal complexing agents can be present in the polishing composition in any suitable concentration. For example, the one or more complexing agents (i.e., the complexing agents in total) can be present in the polishing composition at a concentration of about 0.01 wt. % or more, e.g., about 0.05 wt. % or more, about 0.1 wt. % or more, about 0.25 wt. % or more, about 0.5 wt. % or more, about 0.75 wt. % or more, about 1 wt. % or more, or about 1.25 wt. % or more. Alternatively, or in addition, the one or more complexing agents (i.e., the complexing agents in total) can be present in the polishing composition at a concentration of about 10 wt. % or less, e.g., about 9 wt. % or less, about 8 wt. % or less, about 7 wt. % or less, about 6 wt. % or less, about 5 wt. % or less. Preferably, the one or more complexing agents (i.e., the complexing agents in total) are present in the polishing composition at a concentration of about 0.05 wt. % to about 0.5 wt. %.

The polishing composition optionally further comprises one or more corrosion inhibitors (i.e., film-forming agents). The corrosion inhibitor can be any suitable corrosion inhibitor for any component(s) of the substrate. Preferably, the corrosion inhibitor is a copper-corrosion inhibitor. For the purposes of this invention, a corrosion inhibitor is any compound, or mixture of compounds, that facilitates the formation of a passivation layer (i.e., a dissolution-inhibiting layer) on at least a portion of the surface being polished. Suitable corrosion inhibitors include, but are not limited to, lysine, and azole compounds, such as benzotriazole (BTA), methyl-benzotriazole (m-BTA), and 1,2,4-triazole (TAZ). Preferably, the corrosion inhibitor is BTA or lysine.

The polishing composition can comprise any suitable amount of the corrosion inhibitor(s). Generally, the polishing composition comprises about 0.005 wt. % to about 1 wt. % (e.g., about 0.01 to about 0.5 wt. %, or about 0.02 to about 0.2 wt. %) of the corrosion inhibitor(s).

The polishing composition optionally further comprises one or more other additives. The polishing composition can comprise a surfactant and/or rheological control agent, including viscosity enhancing agents and coagulants (e.g., polymeric rheological control agents, such as, for example, urethane polymers), a dispersant, a biocide (e.g., Kathon™ LX), and the like. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition can be prepared by any suitable technique, many of which are known to those skilled in the art. The polishing composition can be prepared in a batch or continuous process. Generally, the polishing composition can be prepared by combining the components herein in any order.

The invention also provides a method of polishing a substrate with the polishing composition described herein. The method of polishing a substrate comprises (i) providing a substrate; (ii) providing a polishing pad; (iii) providing the aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

In particular, the invention further provides a method of chemically-mechanically polishing a substrate comprising (i) providing a substrate; (ii) providing a polishing pad; (iii) providing a chemical-mechanical polishing composition comprising (a) abrasive particles, wherein the abrasive particles comprise zirconia, (b) at least one metal ion oxidizer, wherein the at least one metal ion oxidizer comprises metal ions of $Co^{3+}$, $Au^+$, $Ag^+$, $Pt^{2+}$, $Hg^{2+}$, $Cr^{3+}$, $Fe^{3+}$, $Ce^{4+}$, or $Cu^{2+}$, and (c) an aqueous carrier, wherein the pH of the chemical-mechanical polishing composition is in the range of about 1 to about 7, and wherein the chemical-mechanical polishing composition does not contain a peroxy-type oxidizer; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

The polishing composition of the invention is useful for polishing any suitable substrate. The polishing composition is particularly useful in the polishing of a substrate comprising an organic polymer film. Suitable substrates include semiconductors, MEMS (microelectromechanical systems), optical waveplates, and substrates comprising anti-reflective coatings (ARC). The organic polymer film can have a dielectric constant of about 3.5 or less (e.g., about 3 or less, about 2.5 or less, about 2 or less, about 1.5 or less, or about 1 or less). Alternatively, or in addition, the organic polymer film can have a dielectric constant of about 1 or more (e.g., about 1.5 or more, about 2 or more, about 2.5 or more, about 3 or more, or about 3.5 or more). For example, the organic polymer film can have a dielectric constant between about 1 and about 3.5. (e.g., between about 2 and about 3, between about 2 and about 3.5, between about 2.5 and about 3, between about 2.5 and about 3.5). Suitable organic polymer films can comprise a polymer such as, for example, polyimide, fluorinated polyimide, polyarylenes and polyarylene ethers (such as SiLK™ from Dow Chemical, FLARE™ from Allied Signal, and VELOX™ from Schumacher), polybenzocyclobutene, divinyl siloxane bisbenzocyclobutene (DVS-BCB), polytetrafluoroethylene (PTFE), polysiloxane, polynaphthylene ether, polyquinolines, paralynes (such as Parylene AF4, an aliphatic tetrafluorinated poly-p-xylylene), copolymers thereof, and combinations thereof. Desirably, the organic polymer film comprises a ring-containing organic polymer, such as a heterocyclic organic polymer (e.g., polybenzoxazole). Preferably, the organic polymer film comprises polybenzoxazole (PBO). The substrate optionally further can comprise one or more metal layers, especially metal layers comprising copper, tantalum, tungsten, titanium, platinum, ruthenium, iridium, aluminum, nickel, or combinations thereof.

The polishing composition is also particularly useful in the polishing of a substrate comprising a phase change alloy (PCA). Suitable PCAs include GST alloys, InSb, and the like. Preferably, the PCA is a GST alloy (e.g., $Ge_2Sb_2Te_5$).

In accordance with the invention, a substrate can be planarized or polished with the polishing composition described herein by any suitable technique. The polishing methods of the invention are particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing composition of the invention and then abrading at least a portion of the surface of the substrate, e.g., the organic polymer film, phase change alloy (PCA), or one or more of the substrate materials described herein, with the polishing composition to polish the substrate.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

EXAMPLES

The following examples further illustrate the invention but, of course, should not be construed as in any way limiting its scope.

Example 1

This example demonstrates the effectiveness of zirconia abrasive particles on the removal rate of polybenzoxazole (PBO) film.

PBO wafers were polished with different polishing compositions using a conventional CMP apparatus. The wafers were polished with eight polishing compositions (Polishing Compositions 1A-1H), each polishing composition containing one of eight different types of abrasive particles.

In particular, polishing compositions 1A-1H were prepared by a combination of one of eight different types of abrasive particles with cerium ammonium nitrate (CAN). Polishing compositions 1A-1F contained 0.14 wt. % CAN, and polishing compositions 1G and 1H contained 0.025 wt. % cerium ammonium nitrate. Polishing compositions 1G and 1H also contained 0.005 wt. % benzotriazole (BTA), which was not included in polishing compositions 1A-1F. The aqueous carrier for each polishing composition was water, and polishing compositions 1A-1F also contained 2 wt. % dimethyl sulfoxide (DMSO). Inventive polishing composition 1A contained zirconia abrasive particles, and comparative polishing compositions 1B-1H did not contain zirconia abrasive particles, but contained different abrasive particles as listed in Table 1. The pH of each polishing composition was adjusted as necessary with nitric acid to a pH of 2.2.

The substrates were polished on a Logitech tabletop polisher with an EPIC™ D100 pad (Cabot Microelectronics, Aurora, Ill.). The polishing parameters were as follows: 20.68 kPa (3 psi) down force, 120 rpm platen speed, 114 rpm head speed, and 150 mL/min polishing composition flow. Following polishing, the removal rate of PBO was determined in Å/min. The results are summarized in Table 1.

TABLE 1

PBO Removal Rate as a Function of Type of Abrasive Particles

| Polishing Composition | Type of Abrasive Particles | Amount of Abrasive Particles (wt. %) | Polishing Rate (Å/mm) |
|---|---|---|---|
| 1A | Zirconia | 1.50 | 3874 |
| 1B | Fumed Alumina | 8.00 | 1061 |
| 1C | Fumed Silica | 20.00 | 222 |
| 1D | Colloidal Silica (mean particle size 100 nm) | 20.00 | 449 |
| 1E | Colloidal Silica (mean particle size 50 nm) | 20.00 | 122 |
| 1F | Ceria | 0.4 | 941 |
| 1G | Treated Alpha Alumina Particles | 8 | 1185 |
| 1H | Alpha Alumina | 1.8 | 998 |

These results demonstrate that the combination of zirconia abrasive particles and a metal ion oxidizer (e.g., cerium ammonium nitrate) is particularly effective for polishing substrates comprising PBO. In particular, polishing composition 1A, comprising zirconia abrasive particles and cerium ammonium nitrate, exhibited a removal rate of over 3500 Å/min for PBO, which is at least three times greater than the removal rate of polishing compositions including other types of abrasive particles in combination with cerium ammonium nitrate.

Example 2

This example demonstrates the effectiveness of cerium ammonium nitrate on the removal rate of polybenzoxazole (PBO).

PBO wafers were polished with different polishing compositions using a conventional CMP apparatus. The wafers were polished with three polishing compositions (Polishing Compositions 2A-2C), each polishing composition containing one of three different types of oxidizers.

In particular, polishing compositions 2A-2C were prepared by a combination of one of three different types of oxidizers with zirconia abrasive particles. Polishing compositions 2A-2C contained 1.5 wt. % zirconia abrasive particles, and the pH of each polishing composition was adjusted as necessary with nitric acid to a pH of 2.2. The aqueous carrier for each polishing composition was water. Inventive polishing composition 2A contained cerium ammonium nitrate, and comparative polishing compositions 2B and 2C did not contain cerium ammonium nitrate, but contained different oxidizers as listed in Table 2.

The substrates were polished on a Logitech tabletop polisher with an EPIC™ D100 pad (Cabot Microelectronics, Aurora, Ill.). The polishing parameters were as follows: 48.26 kPa (7 psi) down force, 120 rpm platen speed, 114 rpm head speed, and 150 mL/min polishing composition flow. Following polishing, the removal rate of PBO was determined in Å/min. The results are summarized in Table 2.

TABLE 2

PBO Removal Rate as a Function of Type of Oxidizer

| Polishing Composition | Type of Oxidizer | Amount of Oxidizer (wt. %) | Polishing Rate (Å/min) |
|---|---|---|---|
| 2A | Cerium Ammonium Nitrate | 0.70 | 6590 |
| 2B | Sodium Hypochlorite | 0.35 | 1085 |
| 2C | Hydrogen Peroxide | 1.5 | 3516 |

These results demonstrate that the combination of a metal ion oxidizer according to the invention (e.g., cerium ammonium nitrate) and zirconia abrasive particles is particularly effective for polishing substrates comprising PBO. In particular, polishing composition 2A, comprising cerium ammonium nitrate and zirconia abrasive particles, exhibited a removal rate of over 6500 Å/min for PBO, which is almost two times greater than the removal rate of a polishing composition including hydrogen peroxide and zirconia abrasive particles, and which is over six times greater than the removal rate of a polishing composition including sodium hypochlorite and zirconia abrasive particles. Thus, these results demonstrate that a metal ion oxidizer according to the invention is more effective than other types of oxidizing agents at polishing PBO.

Example 3

This example demonstrates the effectiveness of zirconia abrasive particles on the removal rate of $Ge_2Sb_2Te_5$ (GST).

GST wafers were polished with different polishing compositions using a conventional CMP apparatus. The wafers were polished with three polishing compositions (Polishing Compositions 3A-3C), each polishing composition containing one of three different types of abrasive particles.

In particular, polishing compositions 3A-3C were prepared by a combination of one of three different types of abrasive particles with cerium ammonium nitrate (CAN). Each polishing composition contained 0.05 wt. % CAN, 0.1 wt. % lysine, 0.0015 wt. % Kathon™ LX. The pH of each composition was adjusted as necessary with nitric acid to a pH of 2.3. The aqueous carrier for each polishing composition was water. Inventive polishing composition 3A contained zirconia abrasive particles, and comparative polishing compositions 3B and 3C did not contain zirconia abrasive particles, but contained different abrasive particles as listed in Table 3.

The substrates were polished on an Applied Materials Reflexion™ polisher with an IC 1010™ pad (from Rodel, Phoenix, Ariz.). The polishing parameters were as follows: 6.89 kPa (1 psi) down force, 60 rpm platen speed, 63 rpm head speed, and 300 mL/min polishing composition flow. The pad was conditioned with a Saesol C7 conditioner disk. Following polishing, the removal rate of GST was determined in Å/min. The results are summarized in Table 3.

TABLE 3

GST Removal Rate as a Function of Type of Abrasive Particles

| Polishing Composition | Type of Abrasive Particles | Amount of Abrasive Particles (wt. %) | Polishing Rate (Å/min) |
|---|---|---|---|
| 3A | Zirconia | 1.50 | 536 |
| 3B | Alumina | 1.0 | 337 |
| 3C | Silica | 2.0 | 200 |

These results demonstrate that the combination of zirconia abrasive particles and a metal ion oxidizer (e.g., cerium ammonium nitrate) is particularly effective for polishing substrates comprising GST. In particular, polishing composition 3A, comprising zirconia abrasive particles and cerium ammonium nitrate, exhibited a removal rate of over 500 Å/min for GST, which is more than two times greater than the removal rate of a polishing composition including silica abrasive particles in combination with cerium ammonium nitrate, and more than 50% greater than the removal rate of a polishing composition including alumina abrasive particles in combination with cerium ammonium nitrate.

Example 4

This example demonstrates the effectiveness of a metal ion oxidizer comprising $Fe^{3+}$ on the removal rate of polybenzoxazole (PBO).

PBO wafers were polished with a polishing composition (i.e., polishing composition 4) using a conventional CMP apparatus. In particular, polishing composition 4 contained 1.5 wt. % zirconia abrasive particles, 0.44 wt. % iron nitrate $(Fe(NO_3)_3 \cdot 9H_2O)$, 0.24 wt. % picolinic acid, and 0.0075 wt. % benzotriazole. The pH of polishing composition 4 was adjusted as necessary with nitric acid to a pH of 2.2. The aqueous carrier was water.

The substrates were polished on an Applied Materials Reflexion™ polisher with an IC 1010™ pad (from Rodel, Phoenix, Ariz.). The polishing parameters were as follows: 20.68 kPa (3 psi) down force, 100 rpm platen speed, 97 rpm head speed, and 300 mL/min polishing composition flow. A first wafer was polished for 30 seconds, and a second wafer was polished for 60 seconds. Following polishing, the removal rate of PBO was determined in Å/min. The removal rate of PBO for the first wafer was 7026 Å/min, and the removal rate of PBO for the second wafer was 7576 Å/min.

These results demonstrate that the combination of a metal ion oxidizer comprising metal ions according to the invention (e.g., $Fe^{3+}$) and zirconia abrasive particles is particularly effective for polishing substrates comprising PBO. Specifically, polishing composition 4 exhibited a high removal rate of over 7000 Å/min for PBO.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of polishing a substrate comprising:
   (i) providing a substrate, wherein the substrate comprises polybenzoxazole;
   (ii) providing a polishing pad;
   (iii) providing a chemical-mechanical polishing composition comprising:
      (a) abrasive particles, wherein the abrasive particles comprise zirconia,
      (b) at least one metal ion oxidizer, wherein the at least one metal ion oxidizer comprises metal ions of $Co^{3+}$, $Au^+$, $Ag^+$, $Pt^{2+}$, $Hg^{2+}$, $Cr^{3+}$, $Fe^{3+}$, $Ce^{4+}$, or $Cu^{2+}$, wherein the at least one metal ion oxidizer is present in the chemical-mechanical polishing composition at a concentration of about 0.025 wt. % to about 0.5 wt. %, and
      (c) an aqueous carrier,
      wherein the pH of the chemical-mechanical polishing composition is in the range of about 1 to about 7, and wherein the chemical-mechanical polishing composition does not contain a peroxy-type oxidizer;
   (iv) contacting the substrate with the polishing pad and the chemical-mechanical polishing composition; and
   (v) moving the polishing pad and the chemical-mechanical polishing composition relative to the substrate to abrade at least a portion of the organic polymer film on a surface of the substrate to polish the substrate.

2. The method of claim 1, wherein the organic polymer film has a dielectric constant of about 2.5 or more.

3. The method of claim 1, wherein the at least one metal ion oxidizer comprises $Fe^{3+}$.

4. The method of claim 1, wherein the at least one metal ion oxidizer comprises $Ce^{4+}$.

5. The method of claim 1, wherein the at least one metal ion oxidizer is cerium ammonium nitrate.

6. The method of claim 1, wherein the abrasive particles consist of zirconia.

7. The method of claim 1, wherein the abrasive particles are present in the chemical-mechanical polishing composition at a concentration of about 0.5 wt. % to about 3 wt. %.

8. The method of claim 1, wherein the chemical-mechanical polishing composition further comprises at least one complexing agent.

9. The method of claim 8, wherein the at least one complexing agent is a mono-, di-, tri- or poly-carboxylic acid, an amine-containing compound, or a mono-, di-, tri-, or poly-phosphonic acid.

10. The method of claim 9, wherein the at least one complexing agent is picolinic acid.

11. The method of claim 1, wherein the chemical-mechanical polishing composition further comprises a corrosion inhibitor.

12. The method of claim 1, wherein the pH of the chemical-mechanical polishing composition is in the range of about 2 to about 3.5.

13. A method of polishing a substrate comprising:
   (i) providing a substrate, wherein the substrate comprises a phase change alloy (PCA);
   (ii) providing a polishing pad;
   (iii) providing a chemical-mechanical polishing composition comprising:
      (a) abrasive particles, wherein the abrasive particles comprise zirconia,
      (b) at least one metal ion oxidizer, wherein the at least one metal ion oxidizer comprises metal ions of $Co^{3+}$, $Au^+$, $Ag^+$, $Pt^{2+}$, $Hg^{2+}$, $Cr^{3+}$, $Fe^{3+}$, $Ce^{4+}$, or $Cu^{2+}$, and
      (c) an aqueous carrier,
      wherein the pH of the chemical-mechanical polishing composition is in the range of about 1 to about 7, and wherein the chemical-mechanical polishing composition does not contain a peroxy-type oxidizer;
   (iv) contacting the substrate with the polishing pad and the chemical-mechanical polishing composition; and
   (v) moving the polishing pad and the chemical-mechanical polishing composition relative to the substrate to abrade at least a portion of the PCA on the surface of a substrate to polish the substrate.

14. The method of claim 13, wherein the phase change alloy (PCA) comprises germanium-antimony-tellurium (GST).

15. The method of claim 13, wherein the at least one metal ion oxidizer comprises $Fe^{3+}$.

16. The method of claim 13, wherein the at least one metal ion oxidizer comprises $Ce^{4+}$.

17. The method of claim 13, wherein the at least one metal ion oxidizer is cerium ammonium nitrate.

18. The method of claim 13, wherein the abrasive particles consist of zirconia.

19. The method of claim 13, wherein the abrasive particles are present in the chemical-mechanical polishing composition at a concentration of about 0.5 wt. % to about 3 wt. %.

20. The method of claim 13, wherein the at least one metal ion oxidizer is present in the chemical-mechanical polishing composition at a concentration of about 0.025 wt. % to about 0.5 wt. %.

21. The method of claim 13, wherein the chemical-mechanical polishing composition further comprises at least one complexing agent.

22. The method of claim 21, wherein the at least one complexing agent is a mono-, di-, tri- or poly-carboxylic acid, an amine-containing compound, or a mono-, di-, tri-, or poly-phosphonic acid.

23. The method of claim 22, wherein the at least one complexing agent is picolinic acid.

24. The method of claim 13, wherein the chemical-mechanical polishing composition further comprises a corrosion inhibitor.

25. The method of claim 13, wherein the pH of the chemical-mechanical polishing composition is in the range of about 2 to about 3.5.

* * * * *